United States Patent

Platt et al.

[11] Patent Number: 6,115,261
[45] Date of Patent: Sep. 5, 2000

[54] WEDGE MOUNT FOR INTEGRATED CIRCUIT SENSORS

[75] Inventors: William P. Platt, Columbia Heights; Dale J. Hagenson, Wyoming; Douglas P. Mortenson, Maple Grove, all of Minn.

[73] Assignee: Honeywell Inc., Minneapolis, Minn.

[21] Appl. No.: 09/332,616

[22] Filed: Jun. 14, 1999

[51] Int. Cl.[7] .................................................. H05K 1/18
[52] U.S. Cl. .......................... 361/760; 361/765; 361/748; 73/493; 73/514.38; 73/431; 73/777; 200/61.45 R
[58] Field of Search .................................. 361/760, 765, 361/748, 784, 792, 796; 73/493, 514.38, 431, 777; 200/61.45 R

[56] References Cited

U.S. PATENT DOCUMENTS

| | | |
|---|---|---|
| 4,983,246 | 1/1991 | Bunting . |
| 5,168,624 | 12/1992 | Shirai . |
| 5,192,838 | 3/1993 | Breed et al. ........................ 200/61.45 |
| 5,233,873 | 8/1993 | Mozgowiec et al. ..................... 73/497 |
| 5,293,302 | 3/1994 | Hasegawa . |
| 5,325,784 | 7/1994 | Bai et al. . |
| 5,359,493 | 10/1994 | Chiu . |
| 5,412,986 | 5/1995 | Beringhause et al. ................ 73/517 R |
| 5,491,612 | 2/1996 | Nicewarner, Jr. . |
| 5,616,863 | 4/1997 | Koen ......................................... 73/493 |
| 5,646,347 | 7/1997 | Wilblen et al. ...................... 73/514.32 |
| 5,806,365 | 9/1998 | Zumino ............................... 73/514.16 |
| 5,866,818 | 2/1999 | Sumi et al. .......................... 73/514.33 |
| 5,942,685 | 8/1999 | Tabota ...................................... 73/493 |

*Primary Examiner*—Leo P. Picard
*Assistant Examiner*—David Foster
*Attorney, Agent, or Firm*—Albert K. Kau

[57] ABSTRACT

A sensor mount for mounting a sensor to a substrate having a support member, a substrate attachment surface, and a sensor attachment surface. The support member can be attached to the substrate at the substrate attachment surface and the sensor can be attached to the support member at the sensor attachment surface. The sensor mount is shaped so an oblique angle is formed between the plane that includes the substrate attachment surface and the plane that includes the sensor attachment surfaces. Preferably, the support member has a wedge shape.

16 Claims, 4 Drawing Sheets

WEDGE MOUNT FOR INTEGRATED CIRCUIT SENSORS

TECHNICAL FIELD

The present invention relates to a structure for mounting a sensor to a substrate such as a printed wiring board, and in particular to a sensor mount that can be used to mount a plurality of sensors to a substrate so that the sensors can sense in three dimensions.

BACKGROUND OF THE INVENTION

Several types of sensors have a primary axis along which the sensor is most sensitive. When using such sensors, it is often desirable to orient the sensor with its primary axis directed in a particular direction. For example, if acceleration of an object in a particular direction is to be sensed, the primary axis of an accelerometer used to sense the acceleration of that object preferably should be oriented in the direction in which the object accelerates. Another example is where multiple sensors are used to sense a phenomenon (such as acceleration) in three dimensions. Three sensors can be oriented so that the primary axes of the sensors are orthogonal to one another. In other words, the primary axis of a first sensor can be directed along an X-axis, the primary axis of a second sensor can be directed along a Y-axis, and the primary axis of a third sensor can be directed along a Z-axis. Thus, the three sensors can be used to sense in three dimensions.

Difficulties can arise, however, when sensors (such as integrated circuit sensors) are mounted on printed wiring boards (PWBs) or other generally planar substrates. Several types of conventional sensors that are designed to be mounted on PWBs are typically designed either with the primary axis directed perpendicular to the major plane of the PWB (referred to herein as perpendicular axis sensors) or with the primary axis directed parallel to the major plane of the PWB (referred to herein as parallel axis sensors). If a particular application calls for the primary axis of the sensor to be oriented in a direction other than the direction provided by mounting the sensor directly to the PWB (for example, parallel to the major plane of the PWB for a perpendicular axis sensor or perpendicular to the major plane of the PWB for a parallel axis sensor), the sensor cannot be directly mounted to the PWB and have the primary axis directed in the desired direction.

If, for example, three perpendicular axis sensors are used to measure a phenomenon in three dimensions as described above, all three sensors cannot be mounted directly to the PWB and still have the primary axes of the three sensors be orthogonal to each other. In other words, if all three sensors were mounted directly to the PWB, the primary axes of the three sensors would all be oriented in the same direction.

One conventional approach to mounting three sensors to a PWB in order to sense in three dimensions is to attach two, separate smaller PWBs perpendicular to a main PWB at a corner of the main PWB. One sensor is mounted directly to the major surface of the main PWB while the two other sensors are mounted to major surfaces of the two smaller PWBs. In other words, a mounting structure similar to a corner of a box is constructed and one sensor is mounted on each of the three surfaces of the corner mounting structure. Thus, if three perpendicular axis sensors are mounted on each of the three surfaces of the corner mounting structure, the primary axes of the three sensors will be oriented orthogonally with respect to each other.

Such conventional corner mounting structures, however, generally require relatively complex, non-planar electrical interconnect structures that must span the several surfaces of the corner mounting structure in order to connect the sensors mounted on the smaller PWBs to the circuitry on the main PWB. Also, conventional automated PWB assembly techniques and equipment (such as conventional pick-and-place machines) typically cannot be used to, attach the smaller PWBs to the main PWB and to attach the electrical interconnect structure to the corner mounting structure. Therefore, such corner mounting structures often must be hand assembled, which generally increases assembly costs and decreases the total volume of PWBs that can be assembled in a period of time.

Moreover, such corner mounting structures generally increase the overall height of the PWB assembly, which may be undesirable for some applications. Furthermore, corner mounting structures are more prone than standard planar PWBs to deform due to shock and vibration. Also, since the corner mounting structures are often located at a corner of the main PWB, corner mounting structures impose an additional constraint on the layout of the other PWB components.

Another conventional approach to mounting three sensors to a PWB in order to sense in three dimensions is to include three sensors in a single, three-dimesional sensor module. For example, in the tri-axial accelerometer, Model No. 2420, commercially available from Silicon Designs, Inc. of Issaquah, Wash., three accelerometers are mounted within a single case. The accelerometers are arranged within the case so that the primary axes of the accelerometers are orthogonal with respect to each other. However, such sensor modules tend to be relatively thick and, as a result, tend to increase the overall height of the assembled PWB. Also, such a configuration is not optimal for all applications, and not all sensors are available in such multi-sensor modules.

SUMMARY OF THE INVENTION

The present invention is a sensor mount by which one or more sensors can be attached to a substrate, such as a PWB, so that each of the sensors can sense in a particular direction. For example, the present invention can be used to mount three sensors to a PWB in order to sense in three dimensions. The sensor mount of the present invention is particularly well suited for use with conventional automated PWB assembly techniques and machines, which allows PWBs to be assembled in a more cost effective and efficient manner. Also, the sensor mount of the present invention can be designed with a relatively low profile in order to reduce the overall height of the assembled PWB. Moreover, the sensor mount has a relatively uncomplicated mechanical structure that improves mechanical stability, makes the sensor mount less susceptible to deformation due to shock and vibration, and allows less complex electrical interconnect structures to be used to connect the sensor to circuitry on the PWB.

In one embodiment, a sensor mount for mounting a sensor to a substrate according to the present inventions comprises a support member, a substrate attachment surface, and a sensor attachment surface. The support member can be attached to the substrate at the substrate attachment surface, and the sensor can be attached to the support member at the sensor attachment surface. The substrate attachment surface is formed on the support member and defines a first plane. The sensor attachment surface is also formed on the support member and defines a second plane. The sensor attachment surface is disposed on the support member so that the second plane forms an oblique angle with respect to the first plane.

DETAILED DESCRIPTION OF THE INVENTION

Figure 1:
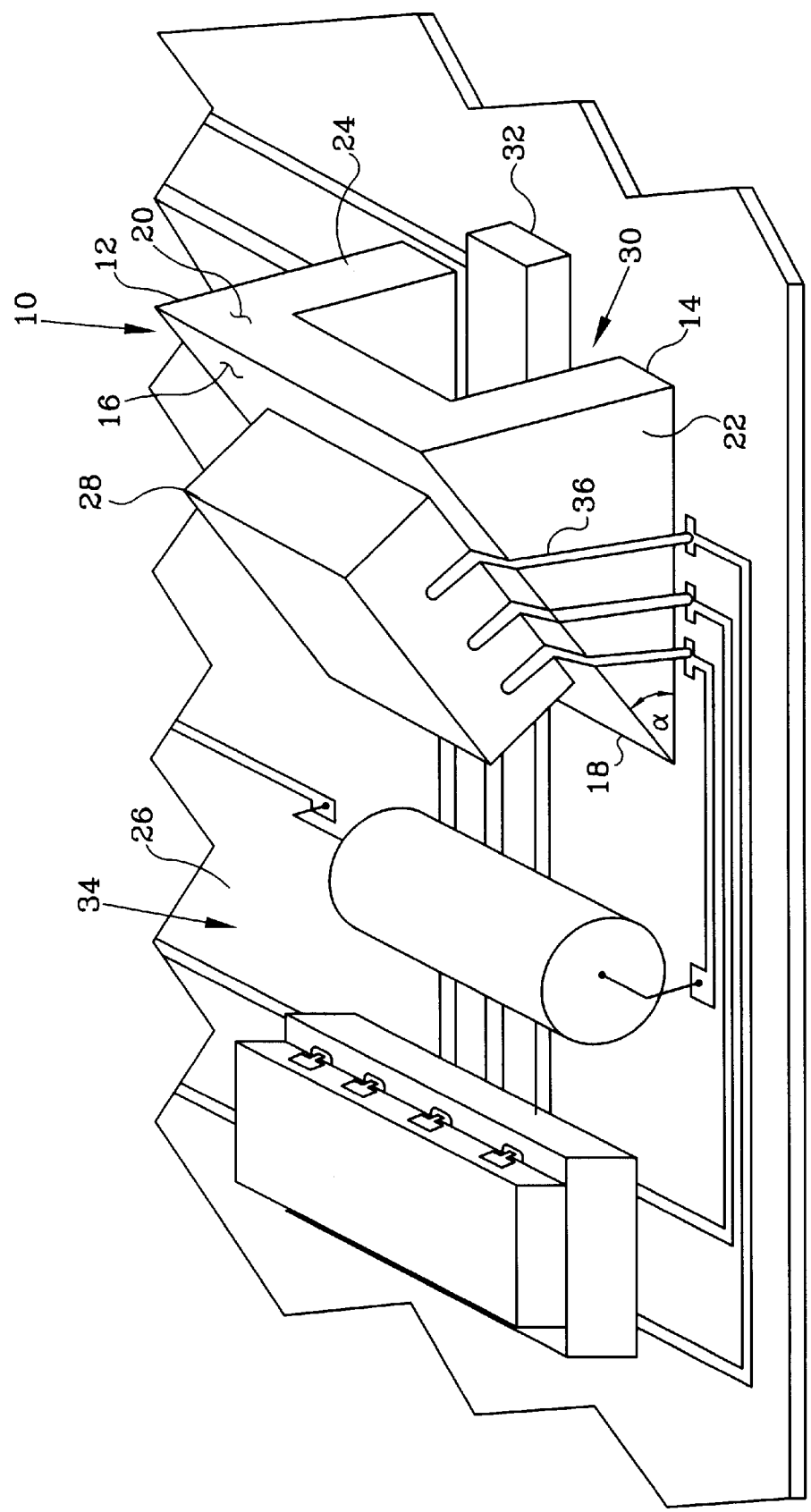
FIG. 1 is an isometric view of a sensor mount of the present invention by which a sensor is mounted to a substrate.

One embodiment of a sensor mount 10 according to the present invention is shown in FIG. 1. Sensor mount 10 includes a support member 12 comprising a substrate attachment surface 14, sensor attachment surface 16, a front edge 18, a back surface 20, and first and second side walls 22 and 24. The sensor mount 10 can be attached to a substrate 26 (for example, a conventional PWB) at the substrate attachment surface 14. A sensor 28 can be attached to the sensor mount 10 at the sensor attachment surface 16 of the support member 12. The sensor mount 10 can be attached to the substrate 26 and the sensor 28 can be attached to the sensor attachment surface 16 in a conventional manner, for example, by using a conventional adhesive, solder, or fastener.

A cavity 30 is formed beneath the sensor attachment surface 16 and between side walls 22 and 24. As shown in FIG. 1, the cavity 30 can be used to free up additional space on the substrate 26 so that circuitry or other components 32 (for example, components of the sensor 28) can be located on the portion of the substrate 26 beneath the cavity 30. Alternatively, the sensor mount 10 can be formed without a cavity 30.

Support member 12 preferably is formed from a relatively lightweight, rigid, insulating material such as the PEI resin sold under the trademark of "ULTEM" by General Electric Company of Fairfield, Conn. However, the support member 12 of the sensor mount 10 can be made from any suitable material including conductive, semi-conductive and insulating materials. The substrate attachment surface 14 and the sensor attachment surface 16 can also be coated or otherwise treated to attach to the substrate and sensor, respectively.

The sensor 28 can be electrically connected to circuitry 34 on the substrate 26 by directly bonding or otherwise connecting the sensor 28 to the substrate circuitry 34. For example, as shown in FIG. 1, wire bonds 36 can be formed using automated bonding equipment that electrically connects the sensor 28 to the circuitry 34 on the substrate 26. The sensor mount 10 can include other types of interconnect structures for electrically connecting the sensor 28 to the circuitry 34 on the substrate 26. For example, the interconnect structure can comprise conductive traces formed on the outer surface of, or embedded within, the support member 12. Also, the interconnect structure can comprise other conventional electrical interconnect structures and printed circuit board technologies such as conventional pin and/or socket interconnect structures.

The sensor attachment surface 16 is slanted with respect to the substrate attachment surface 14 so that the plane defined by the substrate attachment surface 14 and the plane defined by the sensor attachment surface 16 form an oblique angle α. That is, the two planes are neither perpendicular nor parallel. The specific shape of the support member 12 can be designed for use with automated PWB assembly techniques and machines. For example, the side walls 22 and 24, back surface 20, and/or substrate attachment surface 14 can be shaped to provide surfaces that a conventional pick-and-place machine can use to pick up and place the sensor mount 10 on a substrate 26. Preferably, as shown in FIG. 1, support member 12 has a wedge shape and the angle α is in the range of about 35° to about 45°. However, it is to be understood that the sensor mount 10 of the present invention can comprise a support member 12 having any shape that provides a substrate attachment surface 14 and a sensor attachment surface 16 wherein the planes defined by the surfaces 14 and 16 form an oblique angle.

Figure 2:
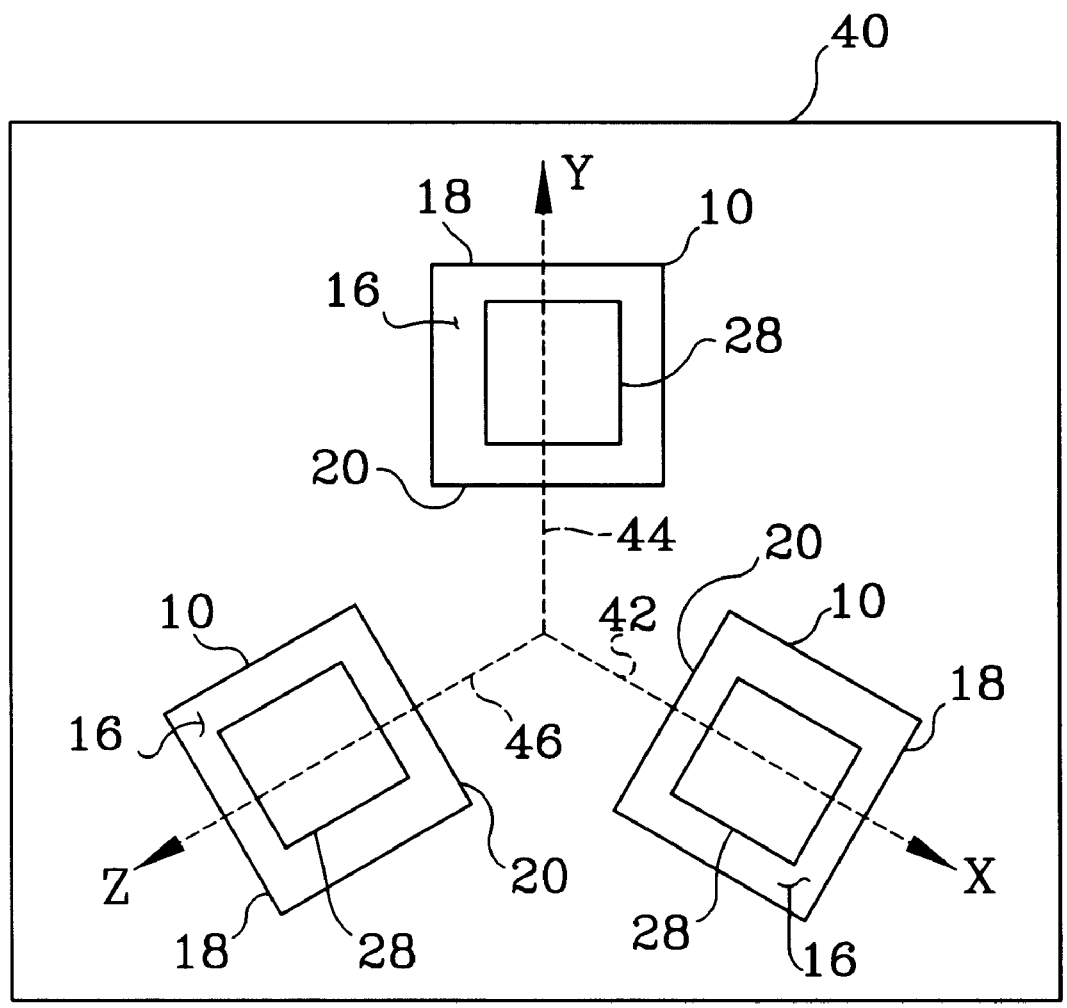
FIG. 2 is a top view of three angularly spaced sensor mounts of the type shown in FIG. 1 that are used to mount three sensors to a substrate so that the sensors can sense in three dimensions.

The sensor mount of the present invention can be used to mount a plurality of sensors to a substrate so that the sensors can sense in three dimensions. One embodiment, shown in FIG. 2, includes three sensor mounts 10 of the type shown in FIG. 1 mounted on a substrate 40 in a circular configuration with the front edge 18 of each sensor mount 10 facing away from the other sensor mounts 10 and the back surface 20 of each sensor mount 10 facing towards the other sensor mounts 10. Each sensor mount 10 is angularly spaced from the other sensor mounts 10 by about 120° and the angle α of each sensor mount 10 is about 35°. Therefore, mounting perpendicular axis sensors 28 on sensor attachment surfaces 16 will cause the primary axes of the three sensors 28 to be orthogonal with respect to each other. In other words, a first sensor 28 will have its primary axis directed along an X axis 42, a second sensor 28 will have its primary axis directed along a Y axis 44, and a third sensor 28 will have its primary axis directed along a Z axis 46 so that the sensors 28 will be able to sense in the X, Y, and Z directions. It is to be understood, however, that the sensor mounts 10 need not be angularly spaced as shown in FIG. 2, nor must the primary axes of the sensors 28 be orthogonal or the angle α be 35°; any convenient arrangement of the sensor mounts 10 and the primary axes of the sensors can be used with appropriate trigonometric compensation.

Figure 3:
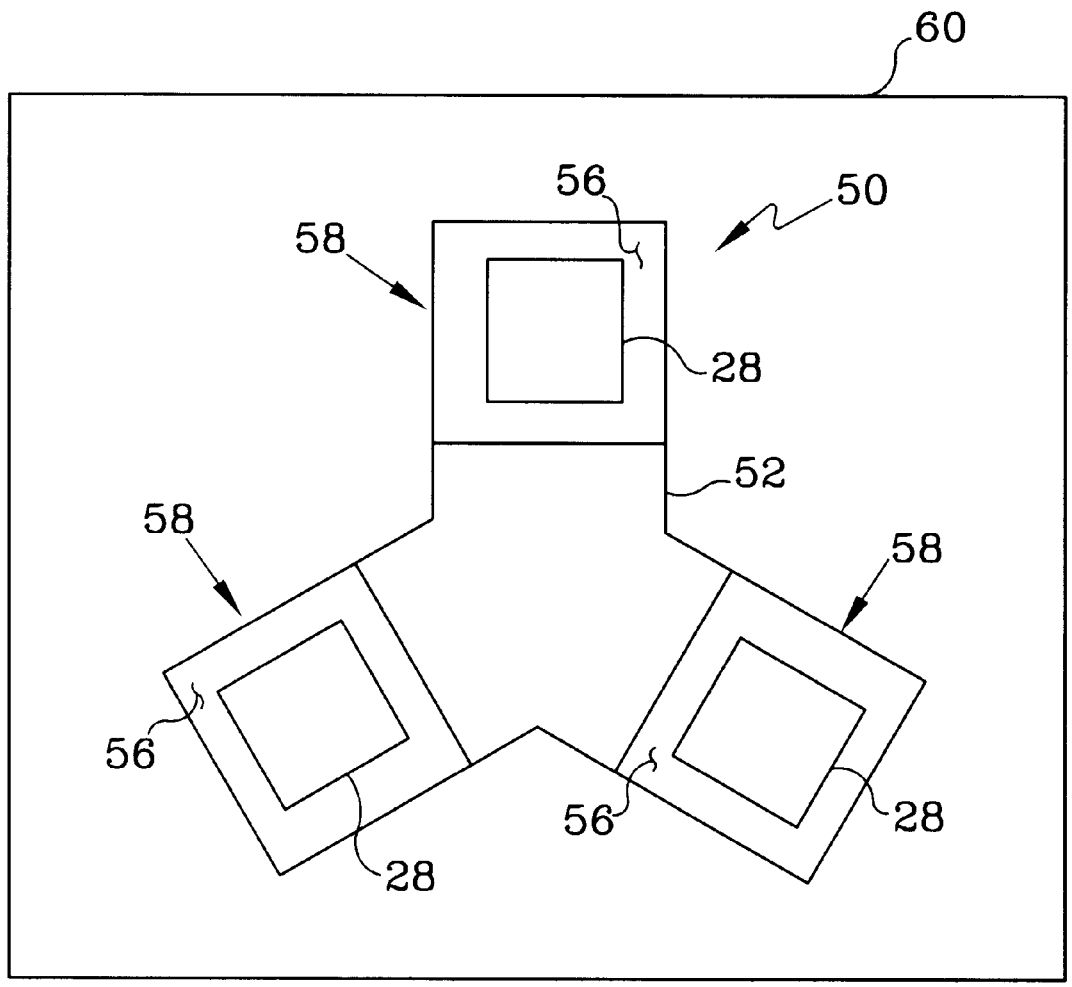
FIG. 3 is a top view of a second embodiment of a sensor mount of the present invention having a plurality of sensor attachment surfaces.
Figure 4:
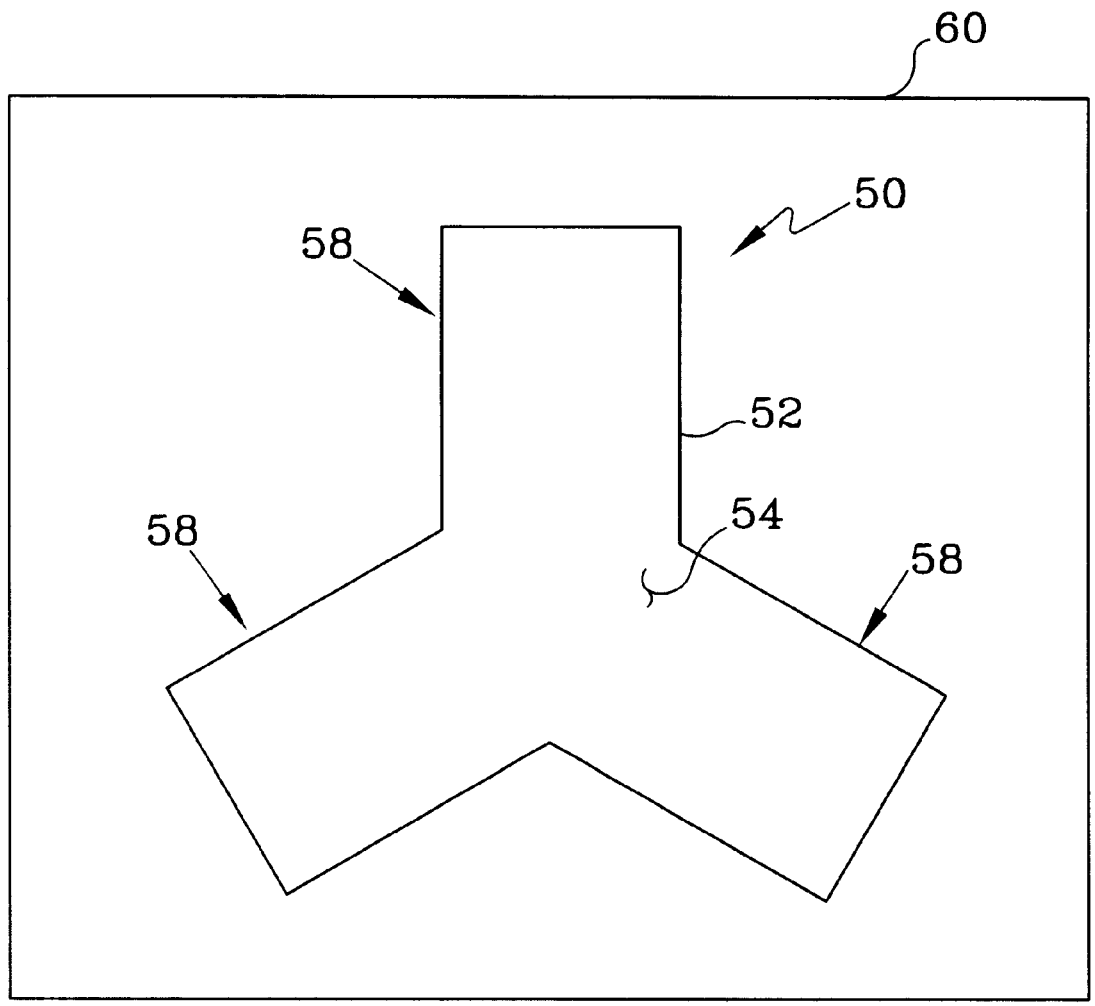
FIG. 4 is a bottom view of the sensor mount of FIG. 3.

Another embodiment of the present invention, sensor mount 50, is shown in FIGS. 3–4, which are top and bottom views, respectively, of the sensor mount 50. The sensor mount 50 comprises a Y-shaped support member 52 having a substrate attachment surface 54 (shown in FIG. 4) and three sensor attachment surfaces 56 (shown in FIG. 3) located at the distal end portions 58 of each of the legs of the Y-shaped support member 52. With the sensor mount 50, three sensors 28 can be mounted to a substrate 60 using a single sensor mount 50 instead of using a plurality of separate sensor mounts 10, as is shown in FIG. 2. The Y-shaped support member 52 arranges the distal end portions 58 in a circular configuration. As with the sensor attachment surface 16 of the sensor mount 10 shown in FIG. 1, each sensor attachment surface 56 is slanted with respect to the substrate attachment surface 54 so that the plane defined by each substrate attachment surface 54 and the plane defined by the sensor attachment surface 56 form an oblique angle. Preferably, the distal end portions of the Y-shaped support member 52 are angularly spaced from each other by about 120°, the oblique angle formed by each sensor attachment surface 56 and the substrate attachment surface 54 is about 35°, and the sensors 28 mounted on each of the sensor attachment surfaces 56 are perpendicular axis sensors 28 so that the primary axes of the three sensors 28 will be orthogonal.

The sensor mounts of the present invention can be advantageously used to mount a plurality of sensors to a substrate, such as a PWB, in order to sense in three dimensions. The sensor mount 10 of the present invention is particularly well suited for use with conventional automated PWB assembly techniques and machines since the sensor mount 10 can be shaped with side walls 22 and 24, a back surface 20, and a substrate attachment surface 14 that provide surfaces for conventional automated PWB assembly machines, such as conventional pick-and-place machines, to grasp the sensor mount 10 and place it on a substrate. Use of automated PWB assembly techniques and machines allows PWBs to be assembled in a more cost effective and efficient manner.

Also, because no sensor need be mounted perpendicular to the major plane of the PWB (as is typically the case with conventional corner mounting structures), the sensor mount of the present invention can be designed with a relatively low profile in order to reduce the overall height of the assembled PWB. Moreover, because the sensor mount of the present invention has a relatively uncomplicated mechanical structure (as opposed to the complex, three-piece designs of conventional corner mounting structures), the sensor mount of the present invention has improved mechanical stability, is less susceptible to deformation due to shock and vibration, and allows less complex electrical interconnect structures to be used to connect the sensor to circuitry on the PWB.

Although the present invention has been described with reference to preferred embodiments, workers skilled in the art will recognize that changes may be made in form and detail without departing from the spirit and scope of the invention.

The embodiments of the invention in which an exclusive property or right is claimed are defined as follows

What is claimed is:

1. A sensor mount for mounting a sensor to a substrate, comprising:
    a support member;
    a substrate attachment surface on the support member defining a first plane, wherein the support member can be attached to the substrate at the substrate attachment surface; and
    a sensor attachment surface on the support member defining a second plane, wherein the sensor attachment surface is disposed on the support member so that the second plane forms an oblique angle with respect to the first plane, and wherein the sensor can be attached to the support member at the sensor attachment surface.

2. The sensor mount of claim 1, wherein the support member has a wedge shape.

3. The sensor mount of claim 2, further comprising a cavity formed in the support member opposite the sensor attachment surface.

4. The sensor mount of claim 1, wherein the oblique angle formed between the first and second planes is in the range of about 35° to about 45°.

5. The sensor mount of claim 4, wherein the oblique angle formed between the first and second planes is about 35°.

6. The sensor mount of claim 1, further comprising a sensor mounted to the sensor attachment surface.

7. The sensor mount of claim 6, wherein the sensor is a parallel axis sensor.

8. The sensor mount of claim 6, wherein the sensor is a perpendicular axis sensor.

9. The sensor mount of claim 6, further comprising an electrical interconnect structure so that the sensor can be electrically connected to circuitry that is mounted on the substrate.

10. The sensor mount of claim 1, wherein the substrate is a printed wiring board.

11. The sensor mount of claim 1, wherein the support member has a plurality of sensor attachment surfaces, wherein each sensor attachment surface is disposed on the support member so that the plane defined by each sensor attachment surface forms an oblique angle with respect to the first plane, and wherein one or more sensors can be attached to each sensor attachment surface.

12. The sensor mount of claim 11, wherein the support member is a Y-shaped support member having three legs, wherein three sensor attachment surfaces are located at distal end portions of each of the legs.

13. The sensor mount of claim 12, wherein the three legs are angularly spaced about 120° from each other.

14. A sensor mount assembly, comprising:
    a substrate;
    a plurality of sensors; and
    a plurality of sensor mounts, wherein each sensor mount has:
        a support member;
        a substrate attachment surface on the support member defining a first plane, wherein each support member is attached to the substrate at the substrate attachment surface; and
        a sensor attachment surface on the support member defining a second plane, wherein the sensor attachment surface is disposed on the support member so that the second plane forms an oblique angle with respect to the first plane, and wherein one of the plurality of sensors can be attached to each support member at the sensor attachment surface.

15. The sensor mount assembly of claim 14, wherein the plurality of support members comprises three support members arranged in a circular configuration on the substrate so that each sensor mount is angularly spaced from the other two sensor mounts by about 120°.

16. The sensor mount assembly of claim 15, wherein the oblique angle formed between the first and second planes of each support member is about 35°.

* * * * *